United States Patent
Long et al.

(10) Patent No.: US 11,342,159 B2
(45) Date of Patent: May 24, 2022

(54) RF PULSING WITHIN PULSING FOR SEMICONDUCTOR RF PLASMA PROCESSING

(71) Applicant: Lam Research Corporation, Fremont, CA (US)

(72) Inventors: Maolin Long, Santa Clara, CA (US); Yuhou Wang, Fremont, CA (US); Ying Wu, Livermore, CA (US); Alex Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/888,613

(22) PCT Filed: Nov. 28, 2018

(86) PCT No.: PCT/US2018/062765
§ 371 (c)(1),
(2) Date: May 29, 2020

(87) PCT Pub. No.: WO2019/112849
PCT Pub. Date: Jun. 13, 2019

(65) Prior Publication Data
US 2020/0335305 A1    Oct. 22, 2020

Related U.S. Application Data

(60) Provisional application No. 62/596,759, filed on Dec. 8, 2017, provisional application No. 62/596,094, filed on Dec. 7, 2017.

(51) Int. Cl.
*H01J 37/32* (2006.01)
*H03K 4/92* (2006.01)

(52) U.S. Cl.
CPC ..... *H01J 37/32128* (2013.01); *H01J 37/3211* (2013.01); *H03K 4/92* (2013.01); *H01J 2237/334* (2013.01)

(58) Field of Classification Search
CPC ............... H01J 37/32082; H01J 37/321; H01J 37/3211; H01J 37/32128; H01J 37/32146; H01J 37/32174; H01J 2237/334; H03K 3/80; H03K 3/57; H03K 5/02; H03K 5/023; H03K 4/92
See application file for complete search history.

(56) References Cited

U.S. PATENT DOCUMENTS 9,754,767 B2     9/2017  Kawasaki
10,102,321 B2 *  10/2018 Povolny ................ G06F 30/367
10,157,729 B2 *  12/2018 Valcore, Jr. ....... H01J 37/32082
10,170,287 B1 *  1/2019  Wu .................... H01J 37/32183

(Continued)

OTHER PUBLICATIONS

ISR PCT/US2018/062765, dated Mar. 22, 2019, 3 pages.

*Primary Examiner* — Haissa Philogene
(74) *Attorney, Agent, or Firm* — Penilla IP, APC

(57) ABSTRACT

A system and method for generating a radio frequency (RF) waveform are described. The method includes defining a train of on-off pulses separated by an off state having no on-off pulses. The method further includes applying a multi-level pulse waveform that adjusts a magnitude of each of the on-off pulses to generate an RF waveform. The method includes sending the RF waveform to an electrode.

33 Claims, 12 Drawing Sheets

(56) References Cited

U.S. PATENT DOCUMENTS

| | | |
|---|---|---|
| 10,264,663 B1 | 4/2019 | Long et al. |
| 10,304,660 B1* | 5/2019 | Shoeb ............... H01J 37/32146 |
| 2002/0068464 A1 | 6/2002 | Forster et al. |
| 2002/0144983 A1 | 10/2002 | Vona, Jr. et al. |
| 2006/0252388 A1 | 11/2006 | Luu |
| 2016/0172216 A1 | 6/2016 | Marakhtanov et al. |
| 2019/0157040 A1* | 5/2019 | Fairbairn .......... H01J 37/32146 |
| 2019/0287764 A1 | 9/2019 | Long et al. |
| 2021/0050185 A1* | 2/2021 | Martinez ........... H01J 37/32183 |
| 2021/0082667 A1* | 3/2021 | Zhao ................. H01L 21/02274 |

* cited by examiner

RF Pulsing within pulsing for TCP source.

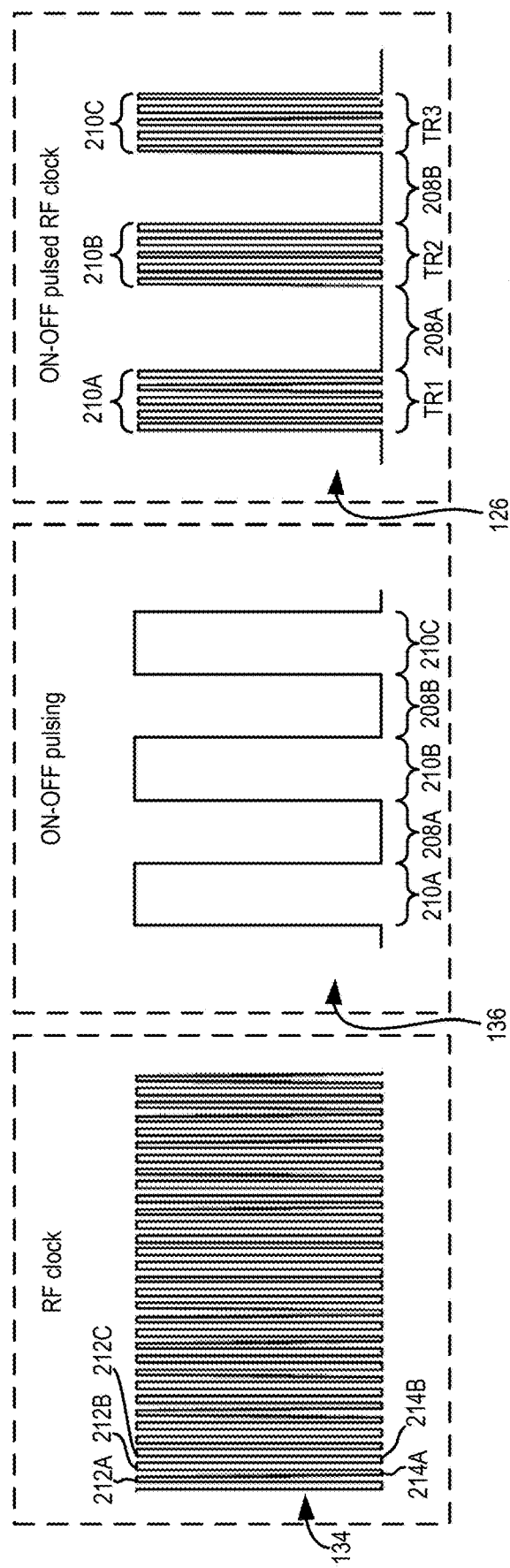

Plasma property in ON-OFF pulsing.

Plasma property in ON-OFF pulsing.

Plasma property in ON-OFF pulsing.

Signal for RF clock

Signal for ON-OFF pulsing

Signal for multi-level pulsing

Signal for arbitrary waveform pulsing

RF current in a plasma load for multi-level pulsing

RF current in a plasma load for multi-level pulsing

RF current in a plasma load for multi-level pulsing

Asynchronous fast TCP-bias ON-OFF pulsing with independent slow multi-level or arbitrary waveform pulsing RF current waveforms with asynchronous fast TCP-bias ON-OFF pulsing and with independent slow multi-level TCP pulsing and arbitrary waveform bias pulsing.

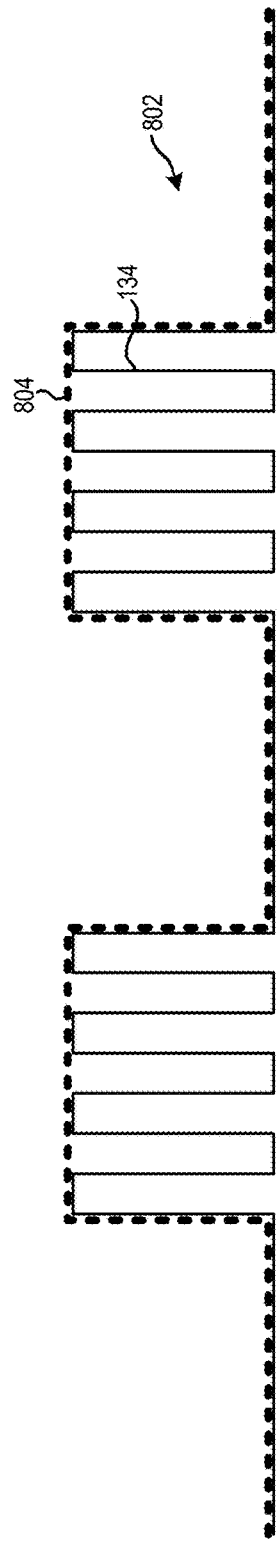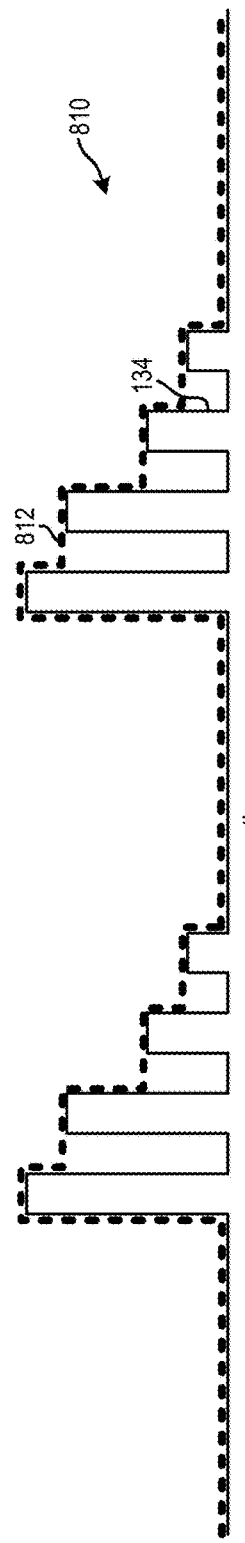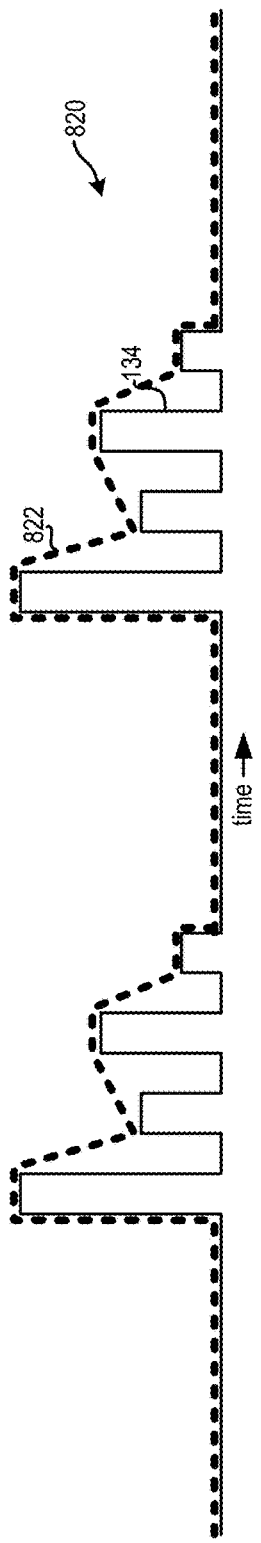
FIG. 8A (Level-to-level pulsing)
FIG. 8B (Multi-level pulsing)
FIG. 8C (Arbitrary waveform)

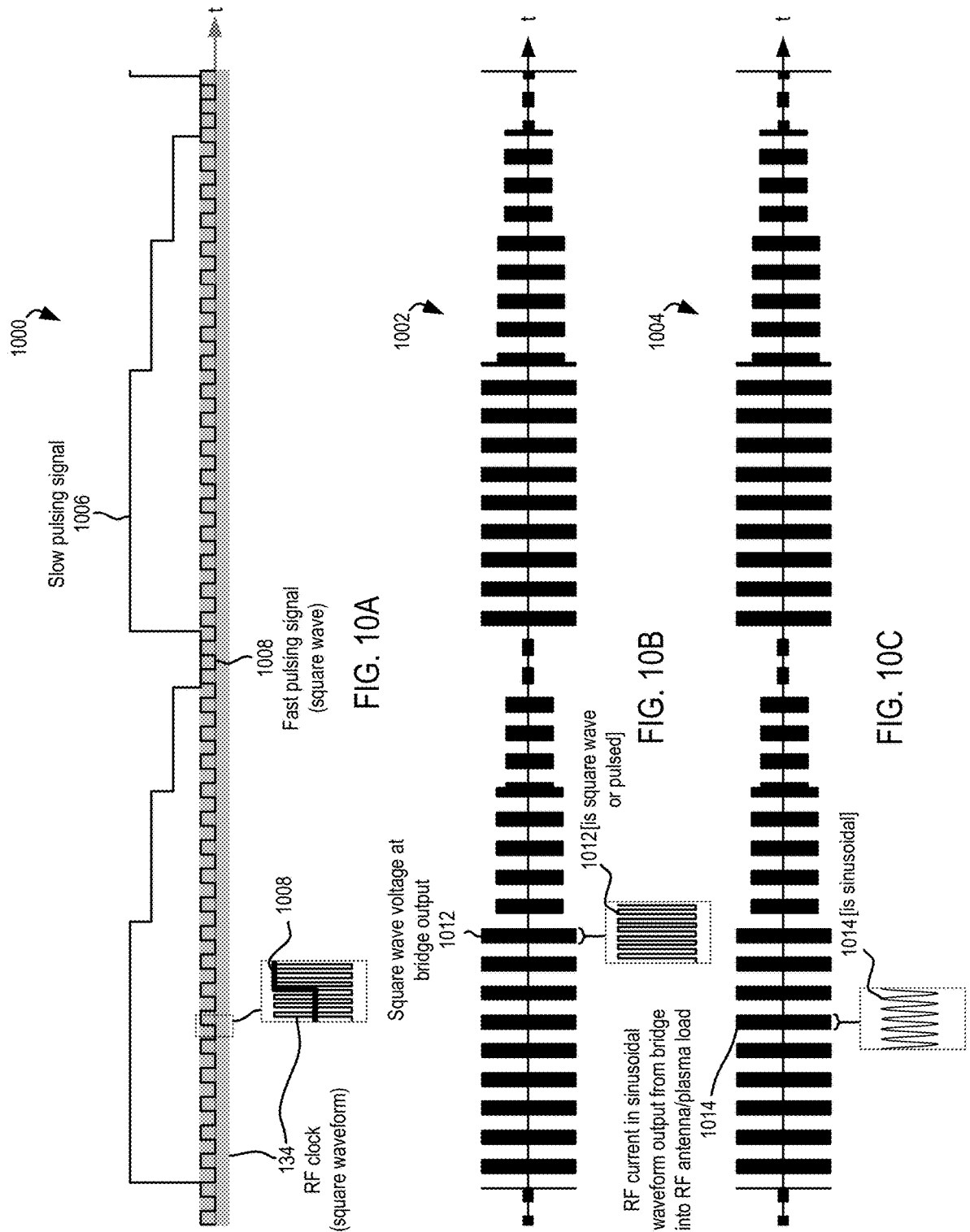

RF PULSING WITHIN PULSING FOR SEMICONDUCTOR RF PLASMA PROCESSING

CLAIM OF PRIORITY

This application is a national stage filing of and claims priority, under 35 U.S.C. § 371, to PCT/US2018/062765, filed on Nov. 28, 2018, and titled "RF PULSING WITHIN PULSING FOR SEMICONDUCTOR RF PLASMA PROCESSING", which claims the benefit of and priority, under 35 U.S.C. § 119(e), to provisional patent application No. 62/596,759, filed on Dec. 8, 2017, and titled "RF PULSING WITHIN PULSING FOR SEMICONDUCTOR RF PLASMA PROCESSING", and provisional patent application No. 62/596,094, filed on Dec. 7, 2017, and titled "RF PULSING WITHIN PULSING FOR SEMICONDUCTOR RF PLASMA PROCESSING", all of which are incorporated by reference herein in their entirety.

FIELD

The present embodiments relate to a radio frequency (RF) pulsing within pulsing for semiconductor RF plasma processing.

BACKGROUND

A plasma system is used to perform a variety of operations on wafers. The plasma system includes a radio frequency (RF) generator, an RF match, and a plasma chamber. The RF generator is coupled to the RF match via an RF cable and the RF match is coupled to the plasma chamber. An RF power is provided via the RF cable and the RF match to the plasma chamber in which a wafer is processed. Also, one or more gases are supplied to the plasma chamber and upon reception of the RF power, plasma is generated within the plasma chamber. During the supply of the one or more gases and the RF power, it is desirable that plasma processing of the wafer is controlled in a desirable manner.

It is in this context that embodiments described in the present disclosure arise.

SUMMARY

Embodiments of the disclosure provide systems, apparatus, methods and computer programs for radio frequency (RF) pulsing within pulsing for semiconductor RF plasma processing. It should be appreciated that the present embodiments can be implemented in numerous ways, e.g., a process, or an apparatus, or a system, or a piece of hardware, or a method, or a computer-readable medium. Several embodiments are described below.

In various embodiments, methods and apparatuses to enable simultaneous fast ON-OFF pulsing and slow pulsing, e.g., level-to-level, or multi-level pulsing, or arbitrary waveform pulsing/modulation, with the fast ON-OFF pulsing being constantly embedded within the slow pulsing are described. Pulsed plasma with more than one pulsing frequency at the same time is provided. The simultaneous fast ON-OFF pulsing and the slow pulsing are implemented in a matchless plasma source.

In some embodiments, "pulsing within pulsing" is defined as the fast ON-OFF pulsing embedded within the slow pulsing. A radio frequency (RF) clock itself is running continuously at an RF frequency. The fast ON-OFF pulsing is to turn ON and OFF the RF clock at inputs of multiple gate drivers, which can be implemented with an AND gate in front of the inputs to the gate drivers. The slow pulsing or modulation is done by manipulating a rail voltage of an agile DC rail. A filter formed by an RF antenna or coil together with one or more reactive elements is a band pass filter for the RF frequency, which turns a square wave at an output of a bridge circuit into a sinusoidal waveform within a tuning range of the RF frequency or the RF clock frequency. The RF clock frequency is tuned in operation so that a plasma load, including the RF antenna and the one or more reactive elements, with or without plasma, appears as purely resistive to the output of the bridge circuit.

Some advantages of the herein described systems and methods are provided. The fast ON-OFF pulsing when applied to a transformer coupled plasma (TCP) source or an inductively coupled plasma (ICP) source produces cold plasma with low electron temperature and plasma potential and thus small angular ion energy distribution. Therefore, this reduces or prevents charging damage in isotropic etch processing. Additionally, the fast ON-OFF pulsing when applied to the TCP or ICP source enables high aspect etching or deposition when combined with asynchronous bias RF pulsing. On the other hand, level-to-level or multi-level or arbitrary waveform pulsing achieves other improved process performances, such as, higher selectivity, higher etch rate, better uniformity, etc. The methods and apparatuses, described herein, enables simultaneous operation of both the fast ON-OFF pulsing and the slow pulsing of level-to-level or multi-level or arbitrary waveform.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

FIG. 2A illustrates an embodiment of a radio frequency (RF) clock signal.

FIG. 2B illustrates an embodiment of an ON-OFF pulsing signal having a frequency $f_{Fast\ pulsing}$.

FIG. 2C illustrates an embodiment of an ON-OFF pulsed RF clock signal that is generated by performing an AND operation between the RF clock signal of FIG. 2A and the ON-OFF pulsing signal of FIG. 2B.

FIG. 8A is a diagram of an embodiment of a graph to illustrate the ON-OFF pulsed RF clock signal shaped according to level-to-level pulsing.

FIG. 8B is a diagram of an embodiment of a graph to illustrate the ON-OFF pulsed RF clock signal shaped according to multi-level pulsing.

FIG. 8C is a diagram of an embodiment of a graph to illustrate the ON-OFF pulsed RF clock signal shaped according to an arbitrary waveform.

FIG. 10A is a diagram to illustrate pulsing-within-pulsing.

FIG. 10B is a diagram to illustrate a square wave voltage at an output of a bridge circuit.

FIG. 10C is a diagram to illustrate an RF current that is output from a bridge circuit to provide to an antenna or a plasma load.

DETAILED DESCRIPTION

The following embodiments describe radio frequency (RF) pulsing within pulsing for semiconductor RF plasma processing. It will be apparent that the present embodiments may be practiced without some or all of these specific details. In other instances, well known process operations have not been described in detail in order not to unnecessarily obscure the present embodiments.

A radiofrequency (RF) clock signal generator is provided in addition to a fast ON-OFF pulsing frequency signal generator. Additionally, a waveform generator is provided to generate a shaping waveform. An RF clock signal that is generated by the RF clock signal generator is filtered using a pulsed signal generated by the fast ON-OFF pulsing frequency signal generator to output a filtered signal. The filtered signal is provided to a gate driver to output multiple square wave signals. The square wave signals are provided to an amplification circuit to generate an amplified square wave signal. The amplified square wave signal is then shaped using a filtered waveform. The filtered waveform is generated by filtering a direct current (DC) voltage using the shaping waveform. The shaping waveform can be an arbitrary shaped waveform, or a multi-level waveform, or a level-to-level waveform. The shaping of the amplified square wave signal generates a shaped waveform. Higher-order harmonics of the shaped waveform is filtered by a reactive circuit to output RF power, which is provided to an electrode for processing a wafer.

Figure 1:
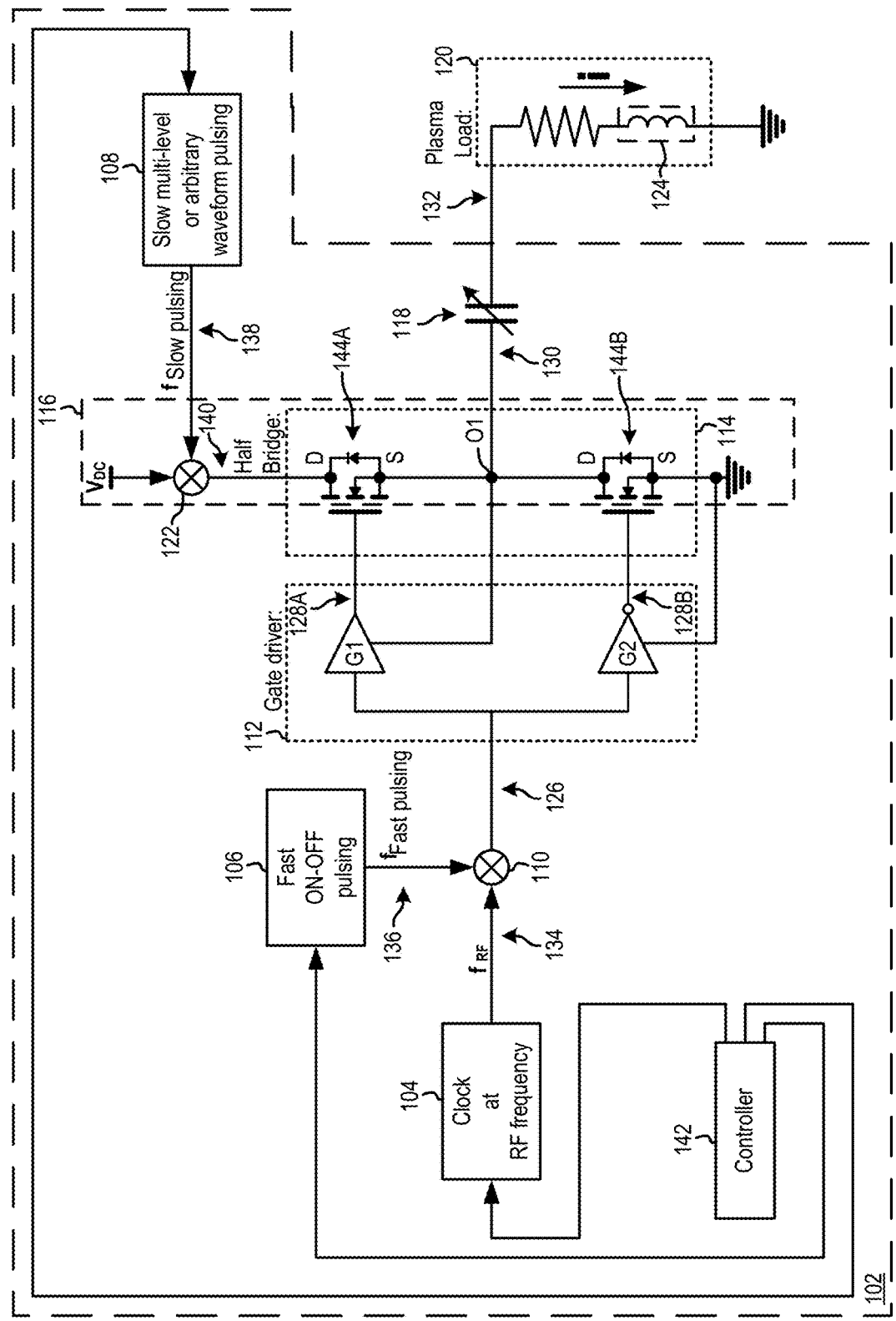
FIG. 1 shows an embodiment of a system for implementing pulsing within pulsing.

FIG. 1 shows an embodiment of a system 100 for implementing a process described herein as "pulsing within pulsing". In one embodiment, the system 100 includes a matchless inductively coupled plasma (ICP) source 102 having a controller, a radio frequency (RF) frequency clock 104, a fast ON-OFF pulsing frequency signal generator 106, a slow pulsing frequency signal generator 108, an AND gate 110, a gate driver 112, a half-bridge circuit 114, a direct current (DC) rail 116 that applies a DC voltage from a DC voltage source $V_{DC}$, a reactive circuit 118, and another AND gate 122. There is no impedance matching circuit and an associated RF cable coupled between the matchless ICP source 102 and a plasma load 120. An AND gate is sometimes referred to herein as a filter. The AND gate 122 is coupled to a drain terminal D of a field effect transistor (FET) 144A of the half-bridge circuit 114. A source terminal S of the FET 144A is coupled to a drain terminal D of another FET 144B of the half-bridge circuit 114 and a source terminal of the FET 144B is coupled to a ground potential.

An example of the reactive circuit 118 is a variable capacitor, which is coupled to the plasma load 120 having an electrode 124, for example, an RF antenna or an RF coil. The RF frequency clock 104 includes an electronic oscillator that generates an RF clock signal 134, which is a digital signal or a square wave signal having a radio frequency. The fast ON-OFF pulsing frequency signal generator 106 includes an electronic oscillator that generates an ON-OFF pulsing signal 136, such as a digital signal or a square wave signal, having a fast ON-OFF pulsing frequency $f_{Fast\ pulsing}$. The fast pulsing frequency $f_{Fast\ pulsing}$ is determined based on dynamics of plasma properties during a transient from RF power ON to RF power OFF. ON-OFF pulsing is achieved using the AND gate 110, which performs an AND operation between the RF clock signal 134 and the ON-OFF pulsing signal 136 as inputs. An AND operation is an example of a filtering operation. The AND gate 110 outputs an ON-OFF pulsed RF clock signal 126.

The gate driver 112 receives the ON-OFF pulsed RF clock signal 126 to output multiple square wave signals 128A and 128B. A gate G1 of the gate driver 112 receives the ON-OFF pulsed RF clock signal 126 and amplifies or does not amplify a magnitude of the ON-OFF pulsed RF clock signal 126 to output the square wave signal 128A. In case, the amplification is not performed, the ON-OFF pulsed RF clock signal 126 passes through the gate G1. Another gate G2 of the gate driver 112 receives the ON-OFF pulsed RF clock signal 126 and inverts the ON-OFF pulsed RF clock signal 126 to output the inverted square wave signal 128B. Each square wave signal 128A and 128B is a digital signal or a pulsed signal. For example, each square wave signal 128A and 128B transitions between a low level and a high level. The square wave signals 128A and 128B are in reverse synchronization with respect to each other. To illustrate, the square wave signal 128A transitions from a low power level to a high power level. During a time interval or a time at which the square wave signal 128A transitions from the low power level to the high power level, the square wave signal 128B transitions from a high power level to a low power level. The reverse synchronization allows the FETs 144A and 144B of the half-bridge circuit 114 to be turned on consecutively and to be turned off consecutively. The half-bridge circuit 114 is sometimes referred to herein as an amplification circuit.

The agile DC rail 116 and the half-bridge circuit 114 generates an amplified square waveform from the square wave signals 128A and 128B. To generate the amplified square waveform, the FETs 144A and 144B are consecutively operated. For example, during a time period in which or a time at which the FET 144A is turned on, the FET 144B is turned off. Moreover, during a time period in which or a time at which the FET 144B is turned on, the FET 144A is turned off. The FETs 144A and 144B are not on at the same time or during the same time period.

When the FET 144A is on, a current flows from the DC voltage source $V_{DC}$ to an output O1 of the half-bridge circuit 114 to generate a voltage at the output O1 and the FET 144B is off. The voltage at the output O1 is generated according to the voltage values received from the pulsing frequency signal generator 108, which includes an electronic oscillator and is sometimes referred to herein as a waveform generator. When the FET 144B is off, there is no current flowing from the output O1 to the ground potential that is coupled to the FET 144B. The current flows from the output O1 to the reactive circuit 118. The current is pushed from the DC voltage source $V_{DC}$ to the capacitor reactive circuit 118 when the FET 144A is on. Moreover, when the FET 144B is on and the FET 144A is off, the voltage that is generated at the output O1 generates a current that flows from the output O1 to the ground potential coupled to the FET 144B. The current is pulled by the ground potential from the output O1. During a time interval in which the FET 144A is off, there is no current flowing from the DC voltage source $V_{DC}$ to the output O1.

Also, the slow pulsing frequency signal generator 108 generates a shaping waveform 138, which has an envelope that has an arbitrary shape, or a multi-level pulse shape, or a level-to-level pulse shape. A slow pulsing frequency of the slow pulsing frequency signal generator 108 or of the shaping waveform 138 is represented as $f_{Slow\ pulsing}$. The level-to-level pulse shape transitions periodically between a low power level and a high power level. The multi-level pulse shape transitions periodically among three or more power levels. The arbitrary shape has a shape that is arbitrary and repeats periodically. The controller 142 controls the slow pulsing frequency signal generator 108 to generate the shaping waveform 138. The controller 142 provides a shape of the shaping waveform 138 to the slow pulsing frequency signal generator 108. The slow pulsing frequency signal generator 108 generates the shaping waveform 138 that has the shape received from the controller 142. A shape of a waveform is a shape of an envelope of the waveform. Examples of an envelope include a peak-to-peak magnitude or a zero-to-peak magnitude.

The AND gate 122 filters, such as ANDs, the DC voltage provided by the DC voltage source $V_{DC}$ with the shaping waveform 138 to generate a filtered waveform 140, which has a magnitude that is shaped according to the shaping waveform 138. The filtered waveform 140 is applied to the amplified square waveform at the output O1 of the half-bridge circuit 114 to shape, such as increase or decrease an envelope of, the amplified square waveform to generate a shaped waveform 130 at the output O1. The shaped waveform 130 is a digital waveform or a square waveform. The envelope of the amplified square waveform is shaped or adjusted by modifying a zero-to-peak amplitude or a peak-to-peak amplitude of the amplified square waveform. Examples of the shaped waveform 130 include a level-to-level shaped waveform, or a multi-level shaped waveform or an arbitrary-shaped waveform and a shape of the shaped waveform 130 matches a shape of the filtered waveform 140. A shape of an envelope of the shaped waveform 130 matches a shape of an envelope of the filtered waveform 140.

The reactive circuit 118 filters out or removes higher-order harmonics of the shaped waveform 130 to output or extract a shaped sinusoidal waveform 132 having RF power, which is provided to the electrode 124 of the plasma load 120 for generating or maintaining plasma within a plasma chamber for processing a substrate. A magnitude of the shaped waveform 130 is a combination of magnitudes of multiple waveforms, one of which has a fundamental frequency and remaining of which have the higher-order harmonics. By filtering out the higher-order harmonics, the shaped sinusoidal waveform 132 having the fundamental frequency is output. The shaped sinusoidal waveform 132 has an envelope with a shape that matches a shape of an envelope of the shaped waveform 130. A plasma chamber includes the plasma load 120. Examples of processing the substrate include depositing a material on the substrate, etching the substrate, cleaning the substrate, and sputtering the substrate. A shape of the shaped sinusoidal waveform 132 is defined by a shape of the filtered waveform 140. For example, an envelope of the shaped sinusoidal waveform 132 has the same shape as an envelope of the filtered waveform 140.

In some embodiments, "pulsing within pulsing" is defined as fast pulsing embedded within slow pulsing. The RF clock generator 104 is running continuously at the RF frequency. "Fast pulsing", in some embodiments, is to turn ON and OFF the RF clock signal 134 at the input of the gate driver 112, and the turning ON and OFF may be implemented with the AND gate 110 in front of the input of the gate driver 112. Slow pulsing or modulation is done by manipulating a rail voltage, which is the DC voltage provided by DC voltage source $V_{DC}$. A filter formed by an RF plasma antenna or coil together with one or more reactive elements, such as the reactive element 118, is a band pass filter for the RF frequency, which turns a square wave at a bridge output into a sinusoidal waveform within a tuning range of the RF frequency or the RF clock frequency. The RF clock frequency is tuned in operation so that the plasma load 120, with or without plasma, and the one or more reactive elements, appear as purely resistive to the output O1 of the half-bridge circuit 114.

In an embodiment, instead of the electrode 124, another electrode, such as a lower electrode or a plate embedded within a substrate support, is used and RF power of the shaped sinusoidal waveform 132 is supplied to the other electrode. Examples of the substrate support include a chuck.

In one embodiment instead of the FETs 144A and 144B being of an n-type, p-type FETs are used.

FIG. 2A illustrates an embodiment of the RF clock signal 134. The RF clock signal 134 has a higher frequency than the ON-OFF pulsing signal 136, which is illustrated in FIG. 2B. For example, multiple pulses of the RF clock signal 134 are generated in a time period in which one pulse of the ON-OFF pulsing signal 136 is generated. The RF clock signal 134 includes multiple instances 212A, 212B, and 212B of an ON state and includes multiple instances 214A and 214B of an OFF state. The instance 214A follows the instance 212A and the instance 212B follows the instance 214A. The instance 214B follows the instance 212B and the instance 212C follows the instance 214B.

FIG. 2B illustrates an embodiment of the ON-OFF pulsing signal 136 having the frequency $f_{Fast\ pulsing}$. The ON-OFF pulsing signal 136 has a radio frequency lower than the frequency of the RF clock signal 134. For example, an on time of a pulse of the ON-OFF pulsing signal 136 is greater than that on time of a pulse of the RF clock signal 134. As another example, an off time of a pulse of the ON-OFF pulsing signal 136 is greater than that an off time of a pulse of the RF clock signal 134. The ON-OFF pulsing signal 136 has multiple instances 210A, 210B, and 210C of an ON state and multiple instances 208A and 208B of an OFF state. The instances of the ON state and the instances of the OFF state repeat periodically. As illustrated in FIG. 2B, the instance 210A is followed by the instance 208A. The instance 208A is followed by the instance 210B and the instance 210B is followed by the instance 208B. The instance 208B is followed by the instance 210C.

FIG. 2C illustrates an embodiment of the ON-OFF pulsed RF clock that is generated by performing the AND operation. As illustrated in FIG. 2C, the pulses of the RF clock signal 134 that are between two adjacent ON pulses of the ON-OFF pulsing signal 136 are filtered out by the AND gate 110 to generate the ON-OFF pulsed RF clock signal 126. The ON-OFF pulsed RF clock 126 includes a train T1 of pulses of the RF clock signal 134, a train T2 of pulses of the RF clock signal 134, and a train T3 of pulses of the RF clock signal 134. The train T1 occurs during the instance 210A of the ON state, the train 210B occurs during the instance 210B of the ON state, and the train 210C occurs during the instance 210C of the ON state. The train T1 is separated from the train T2 by the instance 208A of the OFF state and the train T2 is separated from the train T3 by the instance 208B of the OFF state. During each instance 208A and 208B, the ON-OFF pulsed RF clock signal 126 excludes ON-OFF pulses of the RF clock signal 134. Pulses of the ON-OFF pulsed RF clock signal 126 during each instance 208A and 208B are filtered out by the AND gate 110 of FIG. 1.

Figure 3A:
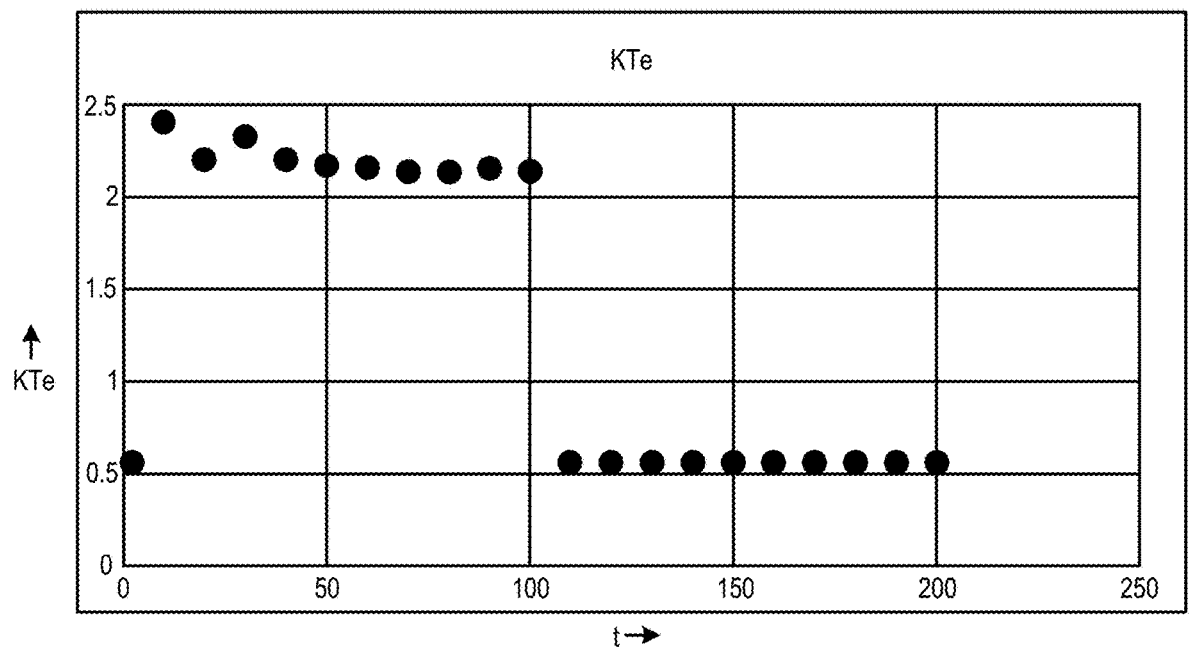
FIG. 3A is an embodiment of a graph illustrating a transient of electron temperature versus time t within a plasma chamber when a shaped waveform is generated using the ON-OFF pulsed RF clock signal.

FIG. 3A is an embodiment of a graph illustrating a transient of electron temperature kTe within the plasma chamber versus time t when the shaped waveform 130 of FIG. 1 is generated using the ON-OFF pulsed RF clock signal 126. The electron temperature transitions from a high state to a low state when the RF power is supplied to the plasma load 120.

Figure 3B:
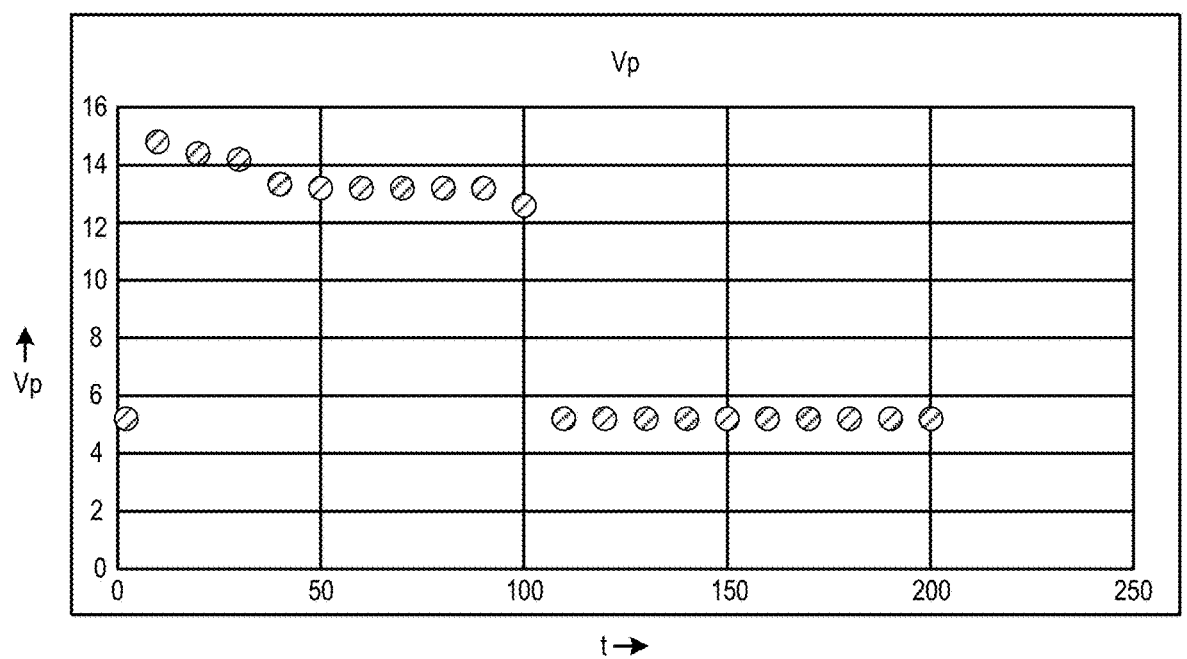
FIG. 3B is an embodiment of a graph illustrating plasma potential versus the time t when the shaped waveform is generated using the ON-OFF pulsed RF clock signal.

FIG. 3B is an embodiment of a graph illustrating plasma potential Vp within the plasma chamber versus the time t when the shaped waveform 130 is generated using the ON-OFF pulsed RF clock signal 126. The plasma potential Vp transitions from a high state to a low state when the RF power is supplied to the plasma load 120.

Figure 3C:
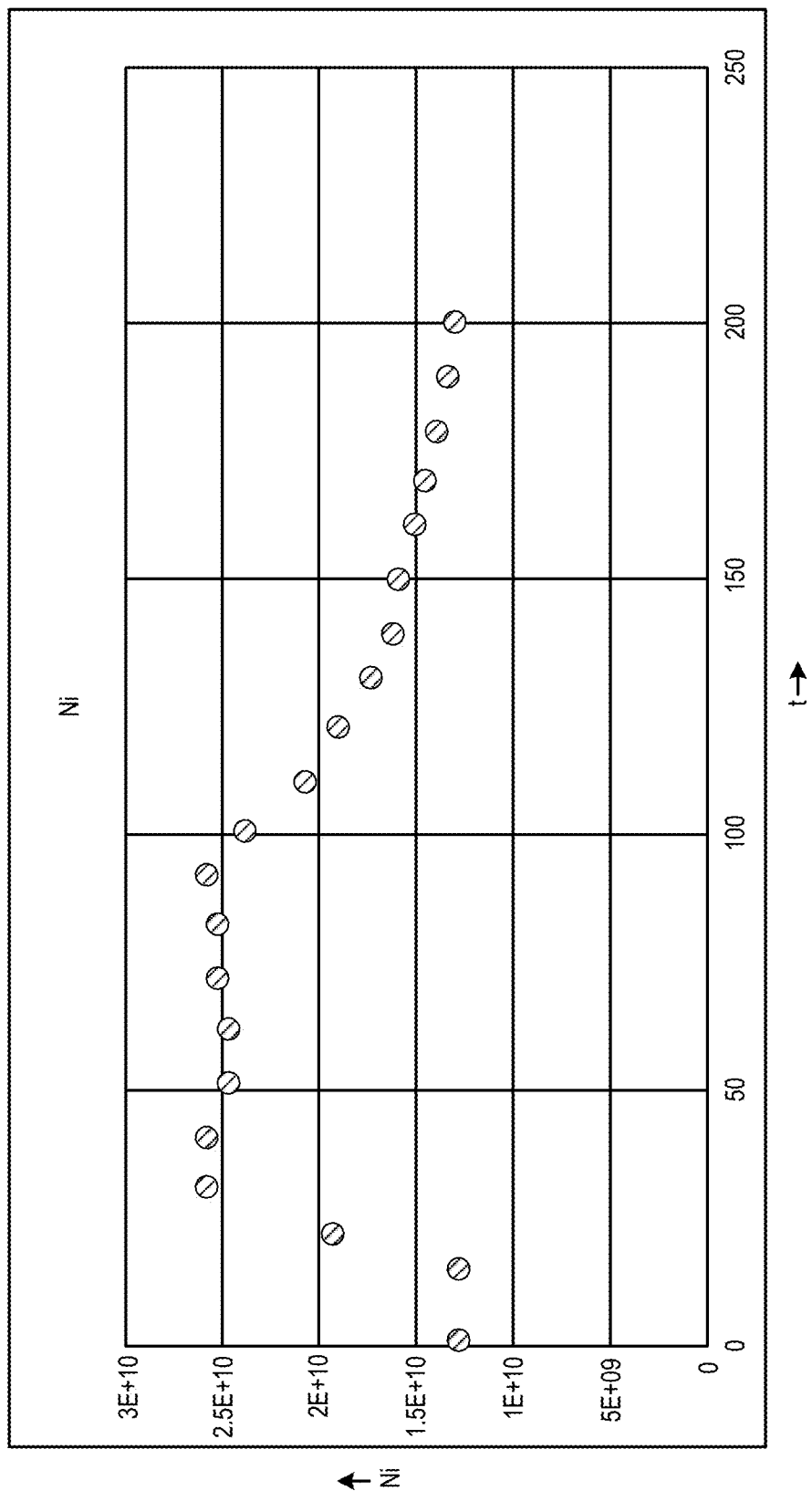
FIG. 3C is an embodiment of a graph illustrating an ion density versus the time t when the shaped waveform is generated using the ON-OFF pulsed RF clock signal

FIG. 3C is an embodiment of a graph illustrating ion density Ni within the plasma chamber versus the time t when the shaped waveform 130 is generated using the ON-OFF pulsed RF clock signal 126. The time t in each FIG. 3A through 3C is measured in microseconds. As illustrated in FIGS. 3A and 3C, it takes about 10 microseconds for electron temperature to transition from a high level to a low level during an OFF time, while the ion density remains at about 80%. So the fast ON-OFF pulsing frequency $f_{Fast\ pulsing}$ may be up to 25 kilohertz (kHz) or higher with a range from about 1 kHz to about 1 megahertz (MHz).

In some embodiments, the plasma chamber, described herein, is a conductor etch chamber used for processing a 300 millimeter wafer. This is just one example. In various embodiments, the plasma chamber, described herein, is a chamber used for processing wafers of other sizes. To illustrate, the plasma chamber is used to process a 200 mm wafer or 450 mm wafer or a wafer of another size.

Angular ion energy, as a function of electron temperature, quickly reaches a minimum in an OFF time of the ON-OFF pulsing signal 136. When bias RF is asynchronously ON-OFF pulsed with TCP ON-OFF pulsing, ions accelerated by the bias RF in the TCP OFF time have a high directionality towards a wafer to produce a desirable vertical profile for etch or a desirable bottom-up deposition for gap fill. This is how high aspect ratio etching is performed to achieve an aspect ratio of up to about 150 in a deep silicon etching (DSE) process. However, when the bias RF operates at multi-level pulsing in asynchronization with the TCP ON-OFF pulsing, the multi-level pulsing frequency is limited by a speed of moving the DC rail 116, with a range of the frequency $f_{Slow\ pulsing}$ from about 10 hertz (Hz) to about 1 kHz. The speed of moving the DC rail 116 is a speed of turning on and off the FETs 144A and 144B of FIG. 1. If TCP ON-OFF pulsing operates at a low pulsing frequency or has a large OFF time of the ON-OFF pulsing signal 136, etch rate is limited by a low average ion density in the OFF time. To fully utilize the merits of ON-OFF pulsing and multi-level pulsing or arbitrary waveform pulsing or level-to-level pulsing, the fast ON-OFF pulsing frequency $f_{Fast\ pulsing}$ is embedded within slow multi-level or arbitrary waveform pulsing or level-to-level pulsing having the slow pulsing frequency $f_{Slow\ pulsing}$. In process applications where bias RF power is utilized, fast ON-OFF pulsing of the bias RF is asynchronized or out-of-phase with the fast ON-OFF pulsing of the TCP source, at the same frequency $f_{Fast\ pulsing}$. ON-OFF pulsing is executed constantly with asynchronization between TCP and bias, while multi-level or arbitrary waveform pulsing for TCP source and bias RF run independently from each other at their own slow pulsing frequencies.

Figure 4A:
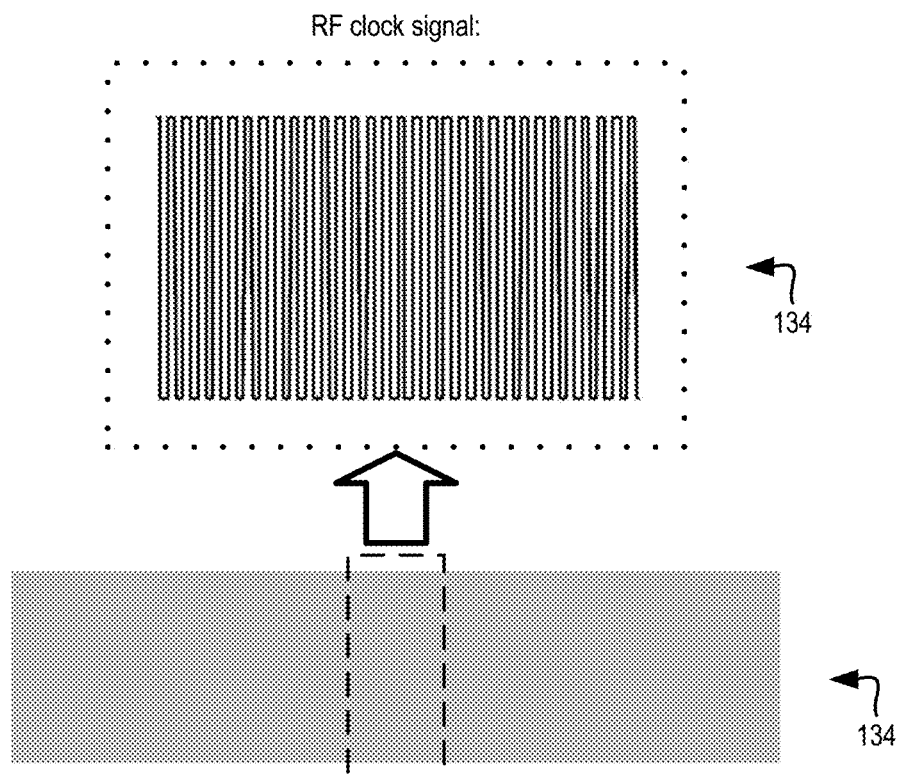
FIG. 4A shows an embodiment of the RF clock signal in a normal view and in a zoom-in view.

FIG. 4A shows an embodiment of the RF clock signal 134 in a normal view and in a zoom-in view. The RF clock signal 134 pulses at a high frequency, such as a radio frequency, between a high level and a low level.

Figure 4B:
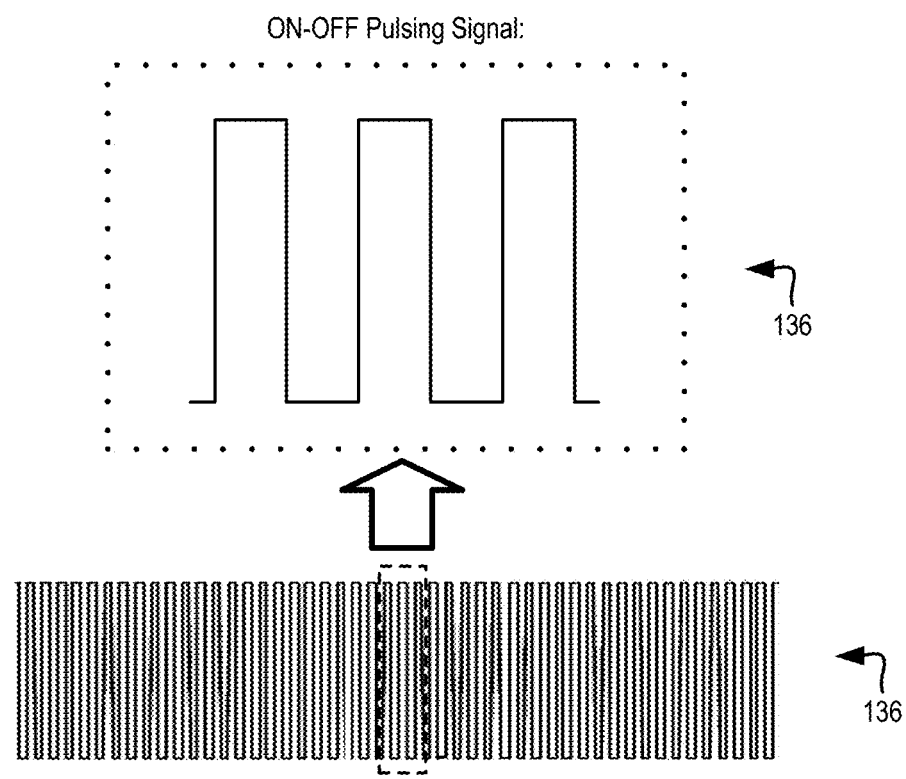
FIG. 4B shows an embodiment of the ON-OFF pulsing signal both in a normal view and in a zoom-in view.

FIG. 4B shows an embodiment of the ON-OFF pulsing signal 136 both in a normal view and in a zoom-in view. The ON-OFF pulsing signal 136 pulses between a high level and a low level at a frequency lower than that of the RF clock signal 134 and the frequency of the ON-OFF pulsing signal 136 is used to filter the RF clock signal 134.

Figure 4C:
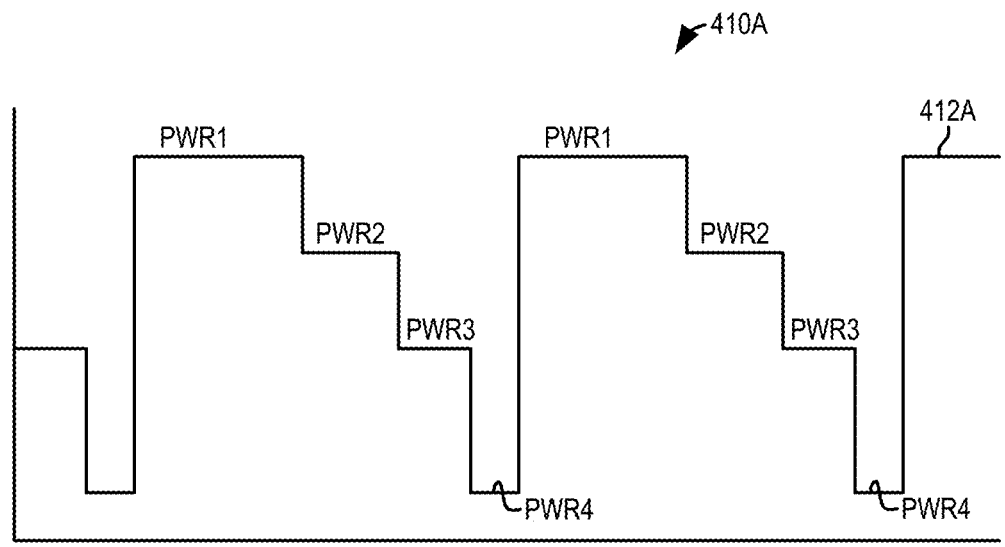
FIG. 4C shows an example of a multi-level pulsing waveform, which is executed in conjunction with the RF clock signal of FIG. 4A filtered by the ON-OFF pulsing signal of FIG. 4B.

FIG. 4C shows an example of a slow pulsing waveform, such as a multi-level pulsing waveform 410A, which is executed simultaneously with the RF clock signal 134 of FIG. 4A and the ON-OFF pulsing signal 136 of FIG. 4B. The multi-level pulsing waveform 410A has a multi-level shaped envelope 412A and is an example of the shaping waveform 138 of FIG. 1. The multi-level shaped envelope 412A is multi-level pulse-shaped and has multiple power levels, such as PWR1, PWR2, PWR3, and PWR4, to be applied to the DC voltage of the DC voltage source $V_{DC}$. The multiple power levels repeat periodically. When the multi-level shaped envelope 412A is applied to the DC voltage of the DC voltage source $V_{DC}$, the filtered waveform 140 having the multi-level shaped envelope 412A is output from the AND gate 122 of FIG. 1.

In one embodiment, instead of the four power levels PWR1 through PWR4, another multi-level pulsing waveform having greater or less than the four power levels is used and the greater or less than the four power levels repeat periodically.

Figure 4D:
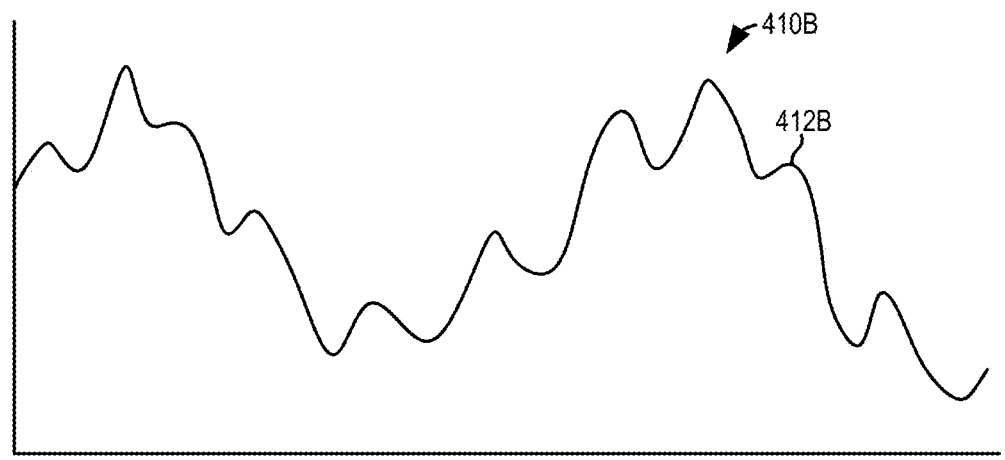
FIG. 4D shows an example of an arbitrary waveform, which is executed in conjunction with the RF clock signal of FIG. 4A filtered by the ON-OFF pulsing signal of FIG. 4B.

FIG. 4D shows an example of another slow pulsing waveform, such as an arbitrary waveform 410B, which is executed simultaneously with the RF clock signal 134 of FIG. 4A and the ON-OFF pulsing signal 136 of FIG. 4B. The arbitrary waveform 410B has an arbitrary-shaped envelope 412B and is another example of the shaping waveform 138 of FIG. 1. The arbitrary-shaped envelope 412B has varying magnitudes for application to the DC voltage of the DC voltage source $V_{DC}$. Upon application of the arbitrary-shaped envelope 412B to the DC voltage of the DC voltage source $V_{DC}$, the filtered waveform 140 having the arbitrary-shaped envelope 412B is generated by the AND gate 122 of FIG. 1.

Figure 5A:
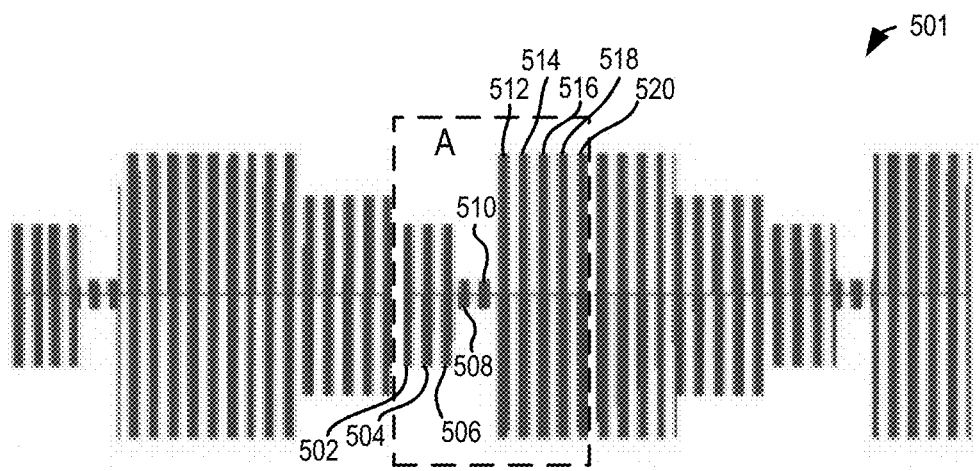
FIG. 5A illustrates an embodiment of an RF current in a plasma load of FIG. 1 when the multi-level pulsing waveform in FIG. 4C is applied.

FIG. 5A illustrates an embodiment of an RF current waveform 501 in the plasma load 120 of FIG. 1 when the multi-level pulsing waveform 410A in FIG. 4C is applied. A section, labeled as A, in FIG. 5A has multiple portions 502, 504, 506, 508, 510, 512, 514, 516, 518, and 520 of the RF current waveform 501. The RF current waveform 501 is generated in the plasma load 120 and is representative of the shaped sinusoidal waveform 132 of FIG. 1.

Figure 5B:
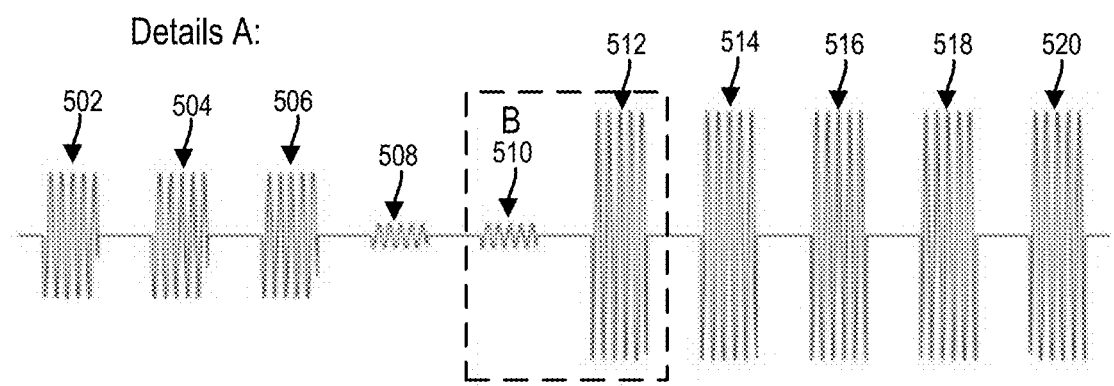
FIG. 5B illustrates zoom-in of the RF current waveform illustrated in FIG. 5A.

FIG. 5B illustrates zoom-in of the RF current waveform 501 illustrated in FIG. 5A. The section A of FIG. 5A is illustrated in detail in FIG. 5B. For example, all the portions 502, 504, 506, 508, 510, 512, 514, 516, 518, and 520 are visible in FIG. 5B in detail. Each portion 502, 504, 506, 508, 510, 512, 514, 516, 518, and 520 is a sinusoidal RF signal, which is illustrated in FIG. 5C.

Figure 5C:
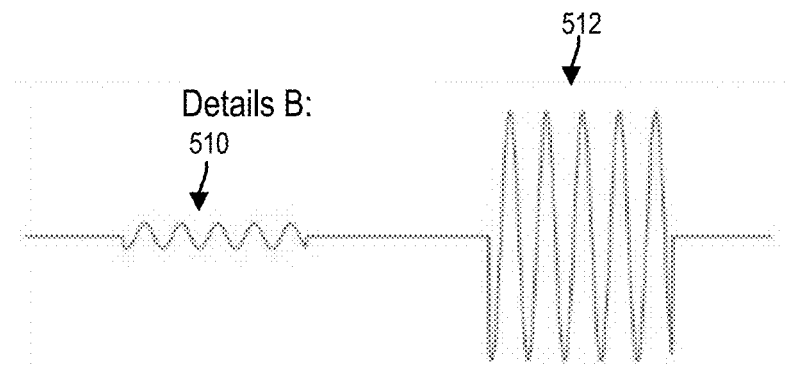
FIG. 5C illustrates a sinusoidal waveform, which is a zoom-in of the RF current waveform illustrated in FIG. 5B.

Also, FIG. 5C illustrates a sinusoidal waveform, which is a zoom-in of the RF current waveform 501 illustrated in FIG. 5B. FIG. 5C is a zoom-in of a section labeled as B in FIG. 5B. As shown in FIG. 5C, each portion 510 and 512 is a sinusoidal signal.

Figure 6:
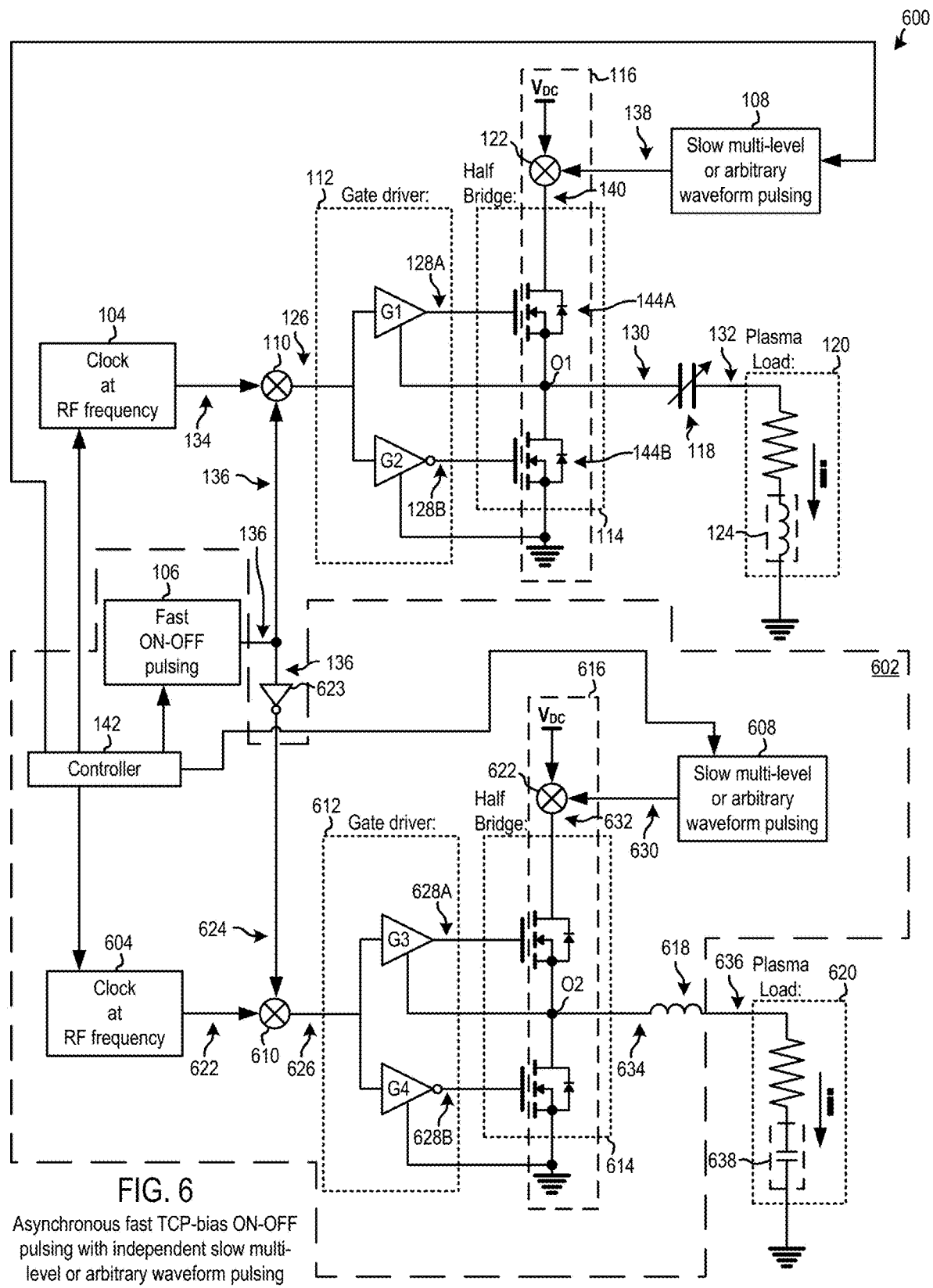
FIG. 6 shows an embodiment of a system that includes a transformer coupled plasma (TCP) source with RF pulsing within pulsing and RF bias with RF pulsing within pulsing.

FIG. 6 shows an embodiment of a system 600 that includes combined TCP source and RF bias with RF pulsing within pulsing. The system 600 includes the matchless ICP source 102 of FIG. 1. The system 600 further includes a NOT gate 623, such as an inverter, and a matchless bias source 602. The matchless bias source 602 includes the controller 142, an RF frequency clock 604, the fast ON-OFF pulsing frequency signal generator 106, an AND gate 610, a slow pulsing frequency signal generator 608, a gate driver 612, a half-bridge circuit 614, a DC rail 616 that is applied a DC voltage of another DC voltage source $V_{DC}$, a reactive circuit 618, and an AND gate 622. An example of the reactive circuit 618 is an inductor, which is coupled to a plasma load 620. The electrode 124 is a coil or an antenna of the plasma chamber and a bias electrode 638 is a lower electrode embedded within a substrate support of the plasma chamber.

The RF clock 604 has the same structure and function as the RF clock 104. Moreover, the gate driver 612 has the same structure and function as the gate driver 112 and the agile DC rail 616 has the same structure and function as the agile DC rail 116. Also, the slow pulsing frequency signal generator 608 has the same structure and function as the slow pulsing frequency signal generator 108. However, the slow pulsing frequency signal generator 608 operates independently of the slow pulsing frequency generator 108. For example, the slow pulsing frequency signal generator 608 generates an arbitrary shape waveform and simultaneously, the slow pulsing frequency signal generator 108 generates a multi-level shape waveform.

The RF clock 604 generates an RF clock signal 622. The NOT gate 623 inverts the ON-OFF pulsing signal 136 to output an inverted ON-OFF pulsing signal 624. For example, during a time interval in which the ON-OFF pulsing signal 136 has an ON state, the inverted ON-OFF pulsing signal 624 has an OFF state and during a time interval in which the ON-OFF pulsing signal 136 has an OFF state, the inverted ON-OFF pulsing signal 624 has an ON state.

The AND gate 610 filters the RF clock signal 622 with the inverted ON-OFF pulsing signal 624 to output an ON-OFF pulsed RF clock signal 626. During a time period in which the ON-OFF pulsed RF clock signal 126 has an ON state or a high power level, the ON-OFF pulsed RF clock signal 626 has an OFF state or a low power level and during the time period in which the ON-OFF pulsed RF clock signal 126 has an OFF state or a low power level, the ON-OFF pulsed RF clock signal 626 has an ON state or a high power level. Multiple instances of the ON state of the ON-OFF pulsed RF clock signal 626 has a train of ON-OFF pulses of the RF clock signal 622 with no pulses of the RF clock signal 622 during multiple instance of the OFF state of the ON-OFF pulsed RF clock signal 626.

A gate G3 of the gate driver 612 receives the ON-OFF pulsed RF clock signal 626 and amplifies or does not amplify the ON-OFF pulsed RF clock signal 626 to output a square wave signal 628A. When the ON-OFF pulsed RF clock signal 626 is not amplified, the ON-OFF pulsed RF clock signal 626 passes through the gate G3 and is output as the square wave signal 628A. Moreover, a gate G4 of the gate driver 612 receives the ON-OFF pulsed RF clock signal 626 and inverts the ON-OFF pulsed RF clock signal 626 to output a square wave signal 628B. The square wave signal 628B is reversely synchronized compared to the square wave signal 628A.

In the same manner in which the half-bridge circuit 114 generates the amplified square waveform, the half-bridge circuit 614 receives the square wave signals 628A and 628B and generates an amplified square waveform from the square wave signals 628A and 628B. Also, the slow pulsing frequency signal generator 608 generates a shaping waveform 630, which has an envelope that has an arbitrary shape, or a multi-level pulse shape, or a level-to-level pulse shape. The controller 142 controls the slow pulsing frequency signal generator 608 to generate the shaping waveform 630. The controller 142 provides a shape of the shaping waveform 630 to the slow pulsing frequency signal generator 608. The shape of the shaping waveform 630 can be different from or the same as the shape of the shaping waveform 138. The slow pulsing frequency signal generator 608 generates the shaping waveform 630 that has the shape received from the controller 142.

The AND gate 622 filters, such as ANDs, the DC voltage provided by the DC voltage source $V_{DC}$ of the matchless bias source 602 with the shaping waveform 630 to generate a filtered waveform 632, which has its magnitude shaped according to the shaping waveform 630. The filtered waveform 632 has an envelope of a shape that is the same as a shape of an envelope of the shaping waveform 630. The filtered waveform 632 is applied to the amplified square waveform at an output O2 of the half-bridge circuit 614 to shape, such as increase or decrease an envelope of, the amplified square waveform of the matchless bias source 602 to generate a shaped waveform 634 at the output O2. The shaped waveform 634 is a digital waveform or a square waveform. The envelope of the amplified square waveform generated within the matchless bias source 602 is adjusted by modifying a zero-to-peak amplitude or a peak-to-peak amplitude of the amplified square waveform. Examples of the shaped waveform 634 include a level-to-level shaped waveform, or a multi-level shaped waveform, or an arbitrary-shaped waveform and a shape of the shaped waveform 634 matches a shape of the filtered waveform 632. A shape of an envelope of the shaped waveform 634 matches a shape of an envelope of the filtered waveform 632.

The reactive circuit 618 filters out or removes higher-order harmonics of the shaped waveform 634 to output or extract a shaped sinusoidal waveform 636 having RF power. The RF power of the shaped sinusoidal waveform 636 is provided to the bias electrode 638 of the plasma load 620 for generating or maintaining plasma within the plasma chamber to process a substrate supported on the substrate support of the plasma chamber. A magnitude of the shaped waveform 634 is a combination of magnitudes of multiple waveforms, one of which has a fundamental frequency and remaining of which have the higher-order harmonics. By filtering out the higher-order harmonics, the shaped sinusoidal waveform 636 having the fundamental frequency is output. The shaped sinusoidal waveform 636 has an envelope with a shape that matches a shape of an envelope of the shaped waveform 634. A shape of the shaped sinusoidal waveform 636 is defined by a shape of the filtered waveform 632. For example, an envelope of the shaped sinusoidal waveform 636 has the same shape as an envelope of the filtered waveform 632.

The matchless ICP source 102 supplies the shaped sinusoidal waveform 132 with RF pulsing within pulsing to the plasma load 120 of the plasma chamber and the matchless bias source 602 supplies the shaped sinusoidal waveform 636 with RF pulsing within pulsing to the plasma load 620 of the plasma chamber. The shaped sinusoidal waveform 636 is reversely synchronized compared to the shaped sinusoidal waveform 132. For example, at a time or during a time period in which the shaped sinusoidal waveform 132 has a high power level, the shaped sinusoidal waveform 636 has a low power level and at a time or during a time period in which the shaped sinusoidal waveform 132 has a low power level, the shaped sinusoidal waveform 636 has a high power level.

In various embodiments, instead of the inductor, one or more capacitors are used as a reactive circuit. In some embodiments, instead of a capacitor, one or more inductors are used as a reactive circuit.

In one embodiment, instead of the NOT gate 623, a phase shifter is used to shift a phase of the ON-OFF pulsing signal 136 to output an ON-OFF pulsing signal that is provided to the AND gate 610.

Figure 7:
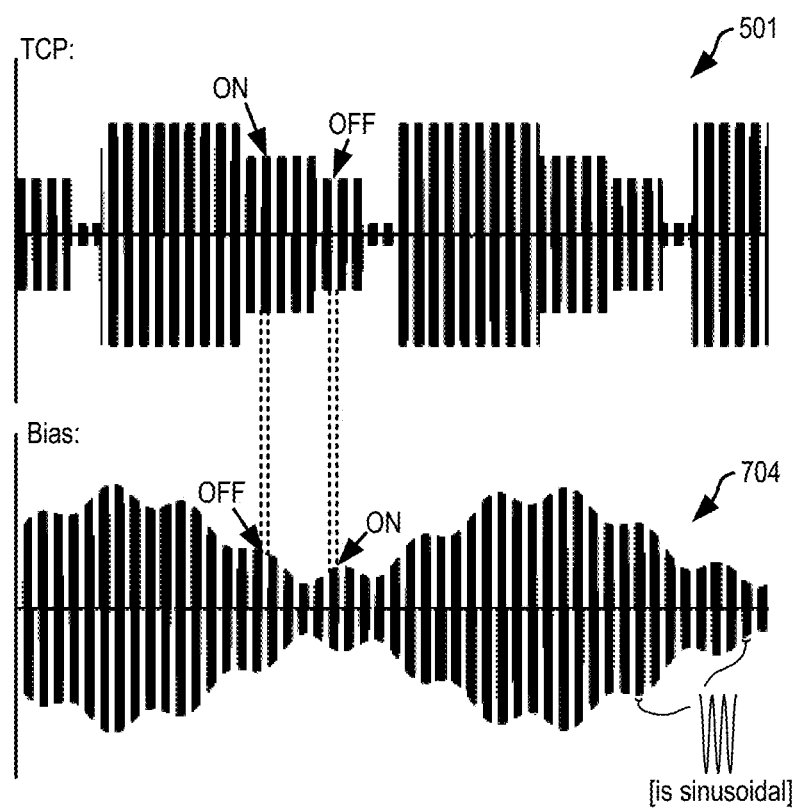
FIG. 7 is an example of an RF current waveform for the TCP source and an RF current waveform for the RF bias with ON-OFF asynchronous TCP-bias pulsing and multi-level TCP pulsing and arbitrary waveform bias pulsing at the same time, where ON-OFF pulsing between TCP and bias is out of phase or asynchronous.

FIG. 7 is an example of the RF current waveform 501 for the TCP source and an RF current waveform 704 for the RF bias with ON-OFF asynchronous TCP-bias pulsing and multi-level TCP pulsing and arbitrary waveform bias pulsing at the same time, where ON-OFF pulsing between TCP and bias is out of phase or asynchronous. For example, the slow pulsing frequency signal generator 108 generates a multi-level pulse shaping waveform to provide the RF current waveform 501 to the plasma load 120 and the slow pulsing frequency signal generator 608 generates an arbitrary-shaped shaping waveform to provide the RF current waveform 704 to the plasma load 620.

In some embodiments, the ON-OFF pulsing between TCP and bias is in phase.

FIG. 8A is a diagram of an embodiment of a graph to illustrate a shaped waveform 802 that is applied to a plasma load, such as the plasma load 120 of FIG. 6 or the plasma load 620 of FIG. 6. The shaped waveform 802 is an example of the shaped waveform 130 generated at the output O1 of the half-bridge circuit 114 of FIG. 6 or of the shaped waveform 634 generated at the output O2 of the half-bridge circuit 614 of FIG. 6. The graph of FIG. 8A plots a magnitude or an amplitude of the shaped waveform 802 over the time t. The shaped waveform 802 is generated based on the RF clock signal 134 and a shaping waveform 804. The shaping waveform 804 is an example of the shaping waveform 138 generated by the slow pulsing frequency signal generator 108 or of a shaping waveform generated by the slow pulsing frequency signal generator 608 of FIG. 6. The shaped waveform 802 is generated when a slow pulsing frequency signal generator, such as the slow pulsing frequency signal generator 108 or 608, applies level-to-level pulsing to the RF clock signal 134. The shaped waveform 802 periodically transitions between a low power level and a high power level.

FIG. 8B is a diagram of an embodiment of a graph to illustrate a shaped waveform 810 that is applied to the plasma load 120 of FIG. 6 or the plasma load 620 of FIG. 6. The shaped waveform 810 is another example of the shaped waveform 130 generated at the output O1 of the half-bridge circuit 114 of FIG. 6 or of the shaped waveform 634 generated at the output O2 of the half-bridge circuit 614 of FIG. 6. The graph of FIG. 8B plots a magnitude of the shaped waveform 810 over the time t. The shaped waveform 810 is generated based on the RF clock signal 134 and a shaping waveform 812, which is an example of the shaping waveform 138 generated by the slow pulsing frequency signal generator 108 or of a shaping waveform generated by the slow pulsing frequency signal generator 608 of FIG. 6. The shaped waveform 810 is generated when the slow pulsing frequency signal generator 108 or 608 applies multi-level pulsing to the RF clock signal 134.

FIG. 8C is a diagram of an embodiment of a graph to illustrate a shaped waveform 820 that is supplied to the plasma load 120 of FIG. 6 or the plasma load 620 of FIG. 6. The shaped waveform 820 is yet another example of the shaped waveform 130 generated at the output O1 of the half-bridge circuit 114 of FIG. 6 or of the shaped waveform 634 generated at the output O2 of the half-bridge circuit 614 of FIG. 6. The graph of FIG. 8C plots a magnitude of the shaped waveform 820 versus the time t. The shaped waveform 820 is generated based on the RF clock signal 134 and a shaping waveform 822, which is an example of the shaping waveform 138 generated by the slow pulsing frequency signal generator 108 or of a shaping waveform generated by the slow pulsing frequency signal generator 608 of FIG. 6. The shaped waveform 820 is generated when the slow pulsing frequency signal generator 108 or 608 applies arbitrary-shaped pulsing to the RF clock signal 134.

Figure 9:
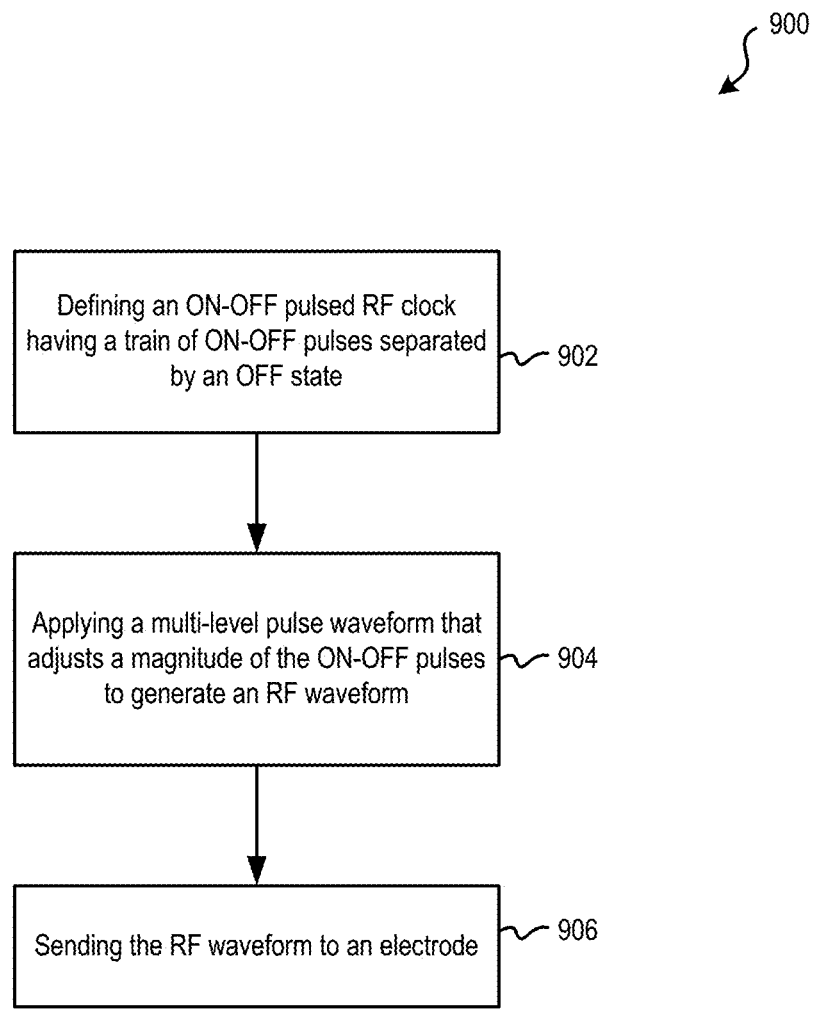
FIG. 9 is a flowchart of an embodiment of a method for generating a pulse within a pulse signal using a matchless RF source.

FIG. 9 is a flowchart of an embodiment of a method 900 to illustrate generation of an RF waveform that is applied to a plasma load, such as the plasma load 120 or 620 of FIG. 6. The method 900 includes an operation 902 of defining an ON-OFF pulsed RF clock, such as the ON-OFF pulsed RF clock 126 or 626 of FIG. 6. The ON-OFF pulsed RF clock has a train of ON-OFF pulses separated by an OFF state having no ON-OFF pulses. The method 900 further includes an operation 902 of applying a shaping waveform, such as the shaping waveform 138 or 630 (FIG. 6), which adjusts a magnitude of the ON-OFF pulsed RF clock to generate a shaped sinusoidal waveform. The shaped sinusoidal waveform can be the shaped sinusoidal waveform 132 or 636 illustrated in FIG. 6. The method 900 includes an operation 904 of sending the shaped sinusoidal waveform to an electrode of a plasma load, such as the plasma load 120 or 620 of FIG. 6.

FIG. 10A is a diagram of an embodiment of a graph 1000 that plots a slow pulsing signal 1006 versus the time t, a fast pulsing signal 1008 versus the time t, and the RF clock signal 134 versus the time t. The slow pulsing signal 1006 is an example of the shaping waveform 138 or 630 of FIG. 6 and the fast pulsing signal 1008 is an example of the ON-OFF pulsing signal 136 of FIG. 6. FIG. 10A illustrates a multi-level pulsing for the slow pulsing signal 1006, with simultaneous fast ON-OFF pulsing.

FIG. 10B is a diagram of an embodiment of a graph 1002 that plots a square wave voltage 1012 at the output O1 of the half-bridge circuit 114 of FIG. 1 versus the time t. The square wave voltage 1012 is an example of the shaped waveform 130 provided at the output O1.

FIG. 10C is a diagram of an embodiment of a graph 1004 that plots an RF current 1014 in a sinusoidal waveform output from the half-bridge circuit 114 of FIG. 1. The RF current 1014 is provided to the electrode 124 of FIG. 1 or the plasma load 120 of FIG. 1. The RF current 1014 is an example of the shaped sinusoidal waveform 132 of FIG. 1.

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller, e.g., a host computer, etc. is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as Application Specific Integrated Circuits (ASICs), programmable logic devices (PLDs), one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, the system includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, and any other semiconductor processing chamber that is associated or used in fabrication and/or manufacturing of semiconductor wafers.

It is further noted that although the above-described operations are described with reference to a transformer coupled plasma (TCP) reactor, in some embodiments, the above-described operations apply to other types of plasma chambers, e.g., conductor tools, a dielectric etch chamber, an ion implantation chamber, a chamber having a showerhead, etc.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method comprising:
defining a first on-off pulsed radio frequency (RF) clock, wherein the first on-off pulsed RF clock has a first plurality of square wave signals and a second plurality of square wave signals, wherein the first plurality of square wave signals and the second plurality of square wave signals are separated by an off state having no on-off pulses;
applying a first shaping waveform that adjusts a magnitude of the first on-off pulsed RF clock to generate a first shaped waveform;
generating a first shaped sinusoidal waveform based on the first shaped waveform; and
sending the first shaped sinusoidal waveform to a first electrode.

2. The method of claim 1, wherein the first electrode is a coil or a substrate support.

3. The method of claim 1, wherein the first on-off pulsed RF clock has an on state, the method further comprising:
inverting the first on-off pulsed RF clock to output an inverted square wave signal; and
outputting an amplified square waveform from a square wave signal and the inverted square wave signal;

wherein said applying the first shaping waveform includes adjusting a magnitude of the amplified square waveform to generate the first shaped waveform, and
wherein said generating the first shaped sinusoidal waveform includes extracting the first shaped sinusoidal waveform from the first shaped waveform.

4. The method of claim 3, wherein said adjusting the magnitude of the amplified square waveform is performed to output a level-to-level shaped waveform or a multi-level shaped waveform or an arbitrary-shaped waveform.

5. The method of claim 1, wherein the first on-off pulsed RF clock has an on state and the off state, wherein the first plurality of square wave signals has a first frequency greater than a second frequency of the on and off states and the second plurality of square wave signals has the first frequency.

6. The method of claim 1, further comprising:
defining a second on-off pulsed RF clock, wherein the second on-off pulsed RF clock has a third plurality of square wave signals and a fourth plurality of square wave signals, wherein the third plurality of square wave signals and the fourth plurality of square wave signals are separated by an off state having no on-off pulses;
applying a second shaping waveform that adjusts a magnitude of the second on-off pulsed RF clock to generate a second shaped waveform;
generating a second shaped sinusoidal waveform based on the second shaped waveform; and
sending the second shaped sinusoidal waveform to a second electrode.

7. The method of claim 6, wherein the second on-off pulsed RF clock is defined based on the first on-off pulsed RF clock.

8. The method of claim 7, wherein the second on-off pulsed RF clock is inverted compared to the first on-off pulsed RF clock.

9. A method comprising:
generating a first clock signal having a radio frequency (RF);
providing a first pulsing signal;
filtering the first clock signal according to on and off states of the first pulsing signal to output a first on-off pulsed RF clock signal;
producing a first plurality of square wave signals from the first on-off pulsed RF clock signal;
generating a first amplified square waveform from the first plurality of square wave signals;
generating a first shaping waveform;
filtering a first direct current (DC) voltage associated with a first agile DC rail according to the first shaping waveform to generate a first filtered waveform;
shaping the first amplified square waveform based on the first filtered waveform to generate a first shaped waveform;
extracting a first shaped sinusoidal waveform from the first shaped waveform, the first shaped sinusoidal waveform being output based on a first shaped envelope defined by the first filtered waveform; and
providing RF power of the first shaped sinusoidal waveform for generating plasma for processing a substrate.

10. The method of claim 9, wherein said producing the first plurality of square wave signals comprises:
allowing the first on-off pulsed RF clock signal to pass through to output a first one of the first plurality of square wave signals; and inverting the first on-off pulsed RF clock signal to output a second one of the first plurality of square wave signals.

11. The method of claim 9, wherein said shaping the first amplified square waveform based on the first filtered waveform to generate the first shaped waveform comprises applying an envelope of the first filtered waveform to the first amplified square waveform to conform an envelope of the first amplified square waveform to the envelope of the first filtered waveform.

12. The method of claim 9, wherein said extracting the first shaped sinusoidal waveform from the first shaped waveform comprises removing higher order harmonics from the first shaped waveform to output a fundamental frequency waveform.

13. The method of claim 9, wherein the first shaped envelope is a multi-level pulse-shaped envelope, or a level-to-level shaped envelope, or an arbitrary-shaped envelope.

14. The method of claim 9, wherein said providing the first pulsing signal comprises providing the first pulsing signal at a frequency lower than the radio frequency.

15. The method of claim 9,
wherein said providing the first pulsing signal comprises providing a plurality of pulses to provide a plurality of instances of an on state and a plurality of instances of an off state,
wherein each of the plurality of instances of the on state of the first pulsing signal is followed by a corresponding one of the plurality of instances of the off state of the first pulsing signal and each of the plurality of instances of the off state of the first pulsing signal is followed by a corresponding one of the plurality of instances of the on state of the first pulsing signal,
wherein said generating the first clock signal comprises producing a plurality of pulses to provide a plurality of instances of an on state and a plurality of instances of an off state,
wherein each of the plurality of instances of the on state of the first clock signal is followed by a corresponding one of the plurality of instances of the off state of the first clock signal and each of the plurality of instances of the off state of the first clock signal is followed by a corresponding one of the plurality of instances of the on state of the first clock signal.

16. The method of claim 15, wherein said filtering the first clock signal comprises filtering out a number of the plurality of pulses of the first clock signal according to the off state of the first pulsing signal.

17. The method of claim 9, wherein the RF power of the first shaped sinusoidal waveform is provided to a top electrode of a plasma chamber, the method further comprising:
generating a second clock signal having a radio frequency;
inverting the first pulsing signal to output a second pulsing signal;
filtering the second clock signal according to on and off states of the second pulsing signal to output a second on-off pulsed RF clock signal;
producing a second plurality of square wave signals from the second on-off pulsed RF clock signal;
generating a second amplified square waveform from the second plurality of square wave signals;
generating a second shaping waveform;
filtering a second DC voltage associated with a second agile DC rail according to the second shaping waveform to generate a second filtered waveform;

shaping the second amplified square waveform based on the second filtered waveform to generate a second shaped waveform;
extracting a second shaped sinusoidal waveform from the second shaped waveform, the second shaped sinusoidal waveform being output based on a second shaped envelope defined by the second filtered waveform; and
providing RF power of the second shaped sinusoidal waveform to a bias electrode of the plasma chamber.

18. The method of claim 17, wherein the second shaped sinusoidal waveform is in reverse synchronization with the first shaped sinusoidal waveform.

19. A matchless plasma system comprising:
a first matchless plasma source including:
a first radio frequency (RF) clock configured to generate a first clock signal having a radio frequency;
a pulsing generator configured to provide a first pulsing signal;
a first filter configured to filter the first clock signal according to on and off states of the first pulsing signal to output a first on-off pulsed RF clock signal;
a first gate driver configured to receive the first on-off pulsed RF clock signal to produce a first plurality of square wave signals;
a first amplification circuit configured to receive the first plurality of square wave signals from the first gate driver and generate a first amplified square waveform,
a first waveform generator configured to generate a first shaping waveform;
a second filter configured to filter a first direct current (DC) voltage associated with a first agile DC rail according to the first shaping waveform to generate a first filtered waveform, wherein the first filtered waveform shapes the first amplified square waveform to generate a first shaped waveform at an output of the first amplification circuit; and
a first reactive circuit configured to extract a first shaped sinusoidal waveform from the first shaped waveform, the first shaped sinusoidal waveform being output based on a first shaped envelope defined by the first filtered waveform, wherein the first reactive circuit is configured to provide RF power of the first shaped sinusoidal waveform to an electrode.

20. The matchless plasma system of claim 19, wherein the first reactive circuit is configured to extract the first shaped sinusoidal waveform from the first shaped waveform by removing higher order harmonics from the first shaped waveform to output a fundamental frequency waveform.

21. The matchless plasma system of claim 19, wherein the first amplification circuit includes a plurality of transistors, wherein the second filter is coupled to the plurality of transistors.

22. The matchless plasma system of claim 19, wherein the first shaped envelope is a multi-level pulse-shaped envelope, or a level-to-level shaped envelope, or an arbitrary-shaped envelope.

23. The matchless plasma system of claim 19, wherein the first reactive circuit is configured to remove higher-order harmonics of the first shaped waveform to generate a fundamental waveform, wherein the first shaped sinusoidal waveform is the fundamental waveform having the first shaped envelope.

24. The matchless plasma system of claim 19, wherein the first reactive circuit is coupled to the electrode without using an RF match.

25. The matchless plasma system of claim 19, wherein the first DC agile rail includes a DC voltage source, the matchless plasma system further comprising a controller configured to control a shape of the first shaping waveform.

26. The matchless plasma system of claim 19, wherein the first pulsing signal has a frequency lower than the radio frequency.

27. The matchless plasma system of claim 19,
wherein the first pulsing signal has a plurality of pulses to provide a plurality of instances of an on state and a plurality of instances of an off state,
wherein each of the plurality of instances of the on state of the first pulsing signal is followed by a corresponding one of the plurality of instances of the off state of the first pulsing signal and each of the plurality of instances of the off state of the first pulsing signal is followed by a corresponding one of the plurality of instances of the on state of the first pulsing signal,
wherein the first clock signal has a plurality of pulses to provide a plurality of instances of an on state and a plurality of instances of an off state,
wherein each of the plurality of instances of the on state of the first clock signal is followed by a corresponding one of the plurality of instances of the off state of the first clock signal and each of the plurality of instances of the off state of the first clock signal is followed by a corresponding one of the plurality of instances of the on state of the first clock signal.

28. The matchless plasma system of claim 27, wherein the first filter is an AND gate that is configured to filter out a number of the plurality of pulses of the first clock signal according to the off state of the first pulsing signal.

29. The matchless plasma system of claim 19, wherein the first gate driver includes a first gate and a second gate, wherein the first gate is configured to allow the first on-off pulsed RF clock signal to pass through to output a first one of the first plurality of square wave signals and the second gate is configured to invert the first on-off pulsed RF clock signal to output a second one of the first plurality of square wave signals.

30. The matchless plasma system of claim 19, wherein the first filtered waveform shapes an envelope of the first amplified square waveform according to an envelope of the first filtered waveform.

31. The matchless plasma system of claim 19, wherein the electrode is a top electrode of a plasma chamber, the matchless plasma system further comprising:
a second matchless plasma source including:
a second RF clock configured to generate a second clock signal having a radio frequency;
an inverter configured to invert the first pulsing signal to output a second pulsing signal;
a third filter configured to filter the second clock signal according to on and off states of the second pulsing signal to output a second on-off pulsed RF clock signal;
a second gate driver configured to receive the second on-off pulsed RF clock signal to produce a second plurality of square wave signals;
a second amplification circuit configured to receive the second plurality of square wave signals from the second gate driver and generate a second amplified square waveform,
a second waveform generator configured to generate a second shaping waveform;
a fourth filter configured to filter a second DC voltage associated with a second agile DC rail according to the second shaping waveform to generate a second filtered waveform, wherein the second filtered waveform shapes the second amplified square waveform to generate a second shaped waveform at an output of the second amplification circuit; and
a second reactive circuit configured to extract a second shaped sinusoidal waveform from the second shaped waveform, the second shaped sinusoidal waveform being output based on a second shaped envelope defined by the second filtered waveform, wherein the second reactive circuit is configured to provide RF power of the second shaped sinusoidal waveform to a bias electrode of the plasma chamber.

32. The matchless plasma source of claim 31, wherein the first reactive circuit is a capacitor and the second reactive circuit is an inductor.

33. The matchless plasma source of claim 31, wherein the second shaped sinusoidal waveform is in reverse synchronization with the first shaped sinusoidal waveform.

* * * * *